Nov. 15, 1966 J. M. COLLINGS ETAL 3,286,192

SINE WAVE OSCILLATOR WITH PERIODIC INITIAL CONDITION RESETTING MEANS

Filed Feb. 14, 1964

JERRY M. COLLINGS
VICTOR H. SANSUM
*INVENTORS*

BY Flehr & Swain

ATTORNEYS

United States Patent Office 3,286,192
Patented Nov. 15, 1966

3,286,192

SINE WAVE OSCILLATOR WITH PERIODIC INITIAL CONDITION RESETTING MEANS

Jerry M. Collings, Concord, and Victor H. Sansum, Oakland, Calif., assignors to Systron-Donner Corporation, Concord, Calif., a corporation of California Filed Feb. 14, 1964, Ser. No. 344,883
11 Claims. (Cl. 331—45)

This application relates to a precision oscillator and more particularly to a precision oscillator for generating sine waves.

Heretofore a sine wave has been generated by connecting three operational amplifiers in a closed loop. Two of the amplifiers serve as integrators whereas the third amplifier serves as an inverter. By connecting these three amplifiers in a closed loop feedback is provided to cause oscillation in a sinusoidal fashion. The sine wave which is generated has a tendency to decay over a period of time, as for example, within 100 cycles This is objectionable for many reasons. There is therefore a need for a new and improved precision oscillator.

In general, it is an object of the invention to provide a precision sine wave oscillator which has a substantially constant amplitude output.

Another object of the invention is to provide an oscillator of the above character which has low distortion.

Another object of the invention is to provide an oscillator of the above character which has a peak amplitude which is referenced to a D.-C. voltage and which is independent of frequency.

Another object of the invention is to provide an oscillator of the above character which has good frequency stability.

Another object of the invention is to provide an oscillator of the above character in which the frequency is determined essentially by two RC time constants.

Additional objects and features of the invention will appear from the following description in which the preferred embodiments are set forth in conjunction with the accompanying drawings.

Referring to the drawings.

Figure 1:
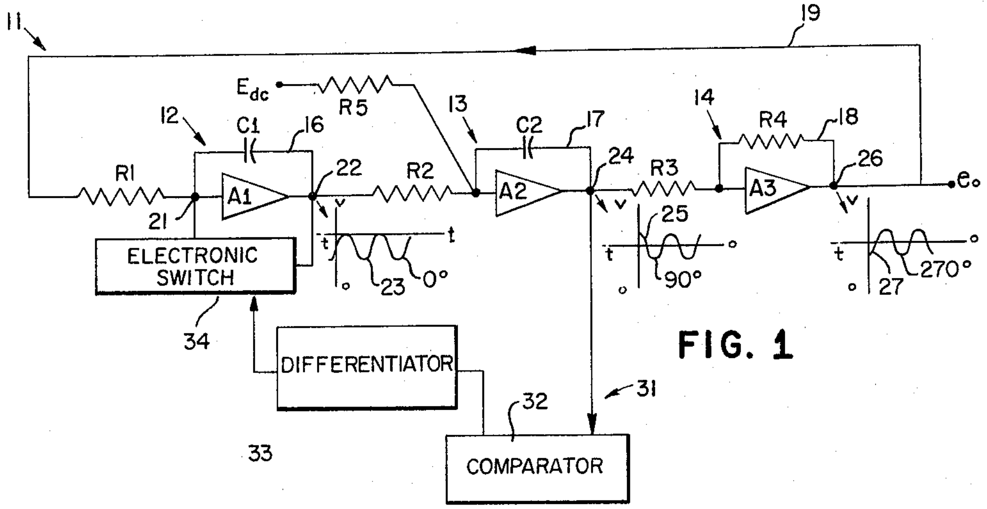
FIGURE 1 is a block diagram of a precision oscillator incorporating our invention.

The precision oscillator which is shown in FIGURE 1 includes a closed loop second order system 11 which has zero damping. This second order system consists of two integrators 12 and 13 and an inverter 14. The integrator 12 consists of an operational amplifier A1 with adjustable capacitor C1 provided in the feedback path 16. Similarly the integrator 13 consists of an operational amplifier A2 with an adjustable capacitor C2 in the feedback path 17. The inverter 14 consists of an operational amplifier A3 in which a resistor R4 is provided in the feedback path 18. Input resistors R1, R2 and R3 are provided for the integrators 12 and 13 and the inverter 14. The output of the inverter 14 is connected to a feedback path 19 which is connected to the input resistor R1 for the integrator 12. The input to this second order system 11 is a D.-C. voltage labeled $E_{dc}$ which is supplied to the input of the second integrator 13 through a resistor R5.

The circuit thus far described is well known to those skilled in the art as a second order system with zero damping. A sinusoidal wave is generated at a frequency determined by the time constants of the two integrators 12 and 13. The output from the integrator 12 at point 22 as shown by the curve 23 is a sine wave of zero degrees and a D.-C. component equal to the peak amplitude of the sine wave This wave 23 travels through the second integrator which causes 270° phase lag so that at point 24 there is generated a sine wave of +90° as shown by the curve 25. The negative D.-C. component of 23 is equal in magnitude to the positive D.-C. component provided by $E_{dc}$. The output of A2 therefore has no D.-C. component. This sine wave goes through 180° phase shift in the inverter 14 so that at point 26 there is produced a 270° sine wave. This 270° sine wave travels through the feedback loop 19 and another 270° phase lag occurs in the integrator 12 to again provide the zero degree sine wave 23. The peak amplitude of the sinusoid generated by the system 11 is determined by the D.-C. voltage supplied by $E_{dc}$ for reasons hereinafter explained.

In the second order system 11, since the initial conditions are applied to the circuit only at the start of oscillation, there is a gradual decay or increase of the sinusoid so that the amplitude of the sinusoid does not remain constant as desired. We have therefore provided means 31 for momentarily reestablishing the original conditions for determining oscillation of the second order system 11, and in fact have provided means for reestablishing the initial conditions in each cycle of oscillation so that the amplitude of the sinusoid is constant to a high degree of accuracy for an indefinite period This means 31 consists of a zero crossing detector or comparator 32 of a suitable type such as a Schmitt trigger circuit. It will be noted that the comparator 32 is connected to the output of the integrator 13 at point 24 because the output wave from the integrator 13 passes through zero in each cycle as shown by the curve 25. It will be noted that the curve 23 does not pass through zero and for that reason the zero crossing detector preferably should not be connected at point 22. If desired, however, the zero crossing detector can be connected at point 26 because the curve 27 does pass through zero.

The Schmitt trigger circuit used as the comparator 32 is well known to those skilled in the art and is essentially a square wave generator which has the same period as the sine wave output of the closed loop second order system 11. Thus, the leading edge of the square wave from the output of the comparator corresponds to the zero crossing of the sinusoid found at the output of the second integrator 13. The output of the comparator 32 is supplied to a differentiator 33 which generates a sharp pulse, i.e., a pulse of short width relative to the period of the sine wave which is supplied to an electronic switch 34 of a suitable type such as a diode switch. The application of the pulse to the diode switch momentarily closes the switch and discharges the capacitor C1 across the switch to thereby establish the initial condition on the first integrator 12. The diode switch causes the residual charge on the capacitor C1 and the operational amplifier A1 to be zero because the sinusoidal output from the integrator 12 is offset by an amount equal to $E_{dc}$ at its output.

A pulse will be generated each time the sine wave passes through zero in a positive going direction, and therefore the initial condition on the integrator 12 is reestablished in each cycle. However, if desired, the Schmitt trigger circuit can be arranged so that a pulse is produced only when the sine wave passes through zero in a negative going direction. It can be readily seen that this is quite different from the conventional sine wave generator in which the initial conditions are applied to the circuit only at the start of oscillation. After an initial condition has been reestablished on the integrator 12, the oscillatory action continues. There also will be some decay, however, since the initial condition is reestablished each cycle, the decay which occurs in a single cycle is really an infinitesimal amount so that the amplitude of the sine wave which is generated by the combined circuitry is substantially constant over indefinite periods of time.

From the foregoing it can be seen that to incorporate our invention into a system two conditions must be met. First, the output in some portion of the system must pass through zero so that a zero crossing detector can be utilized. The second condition is that the initial conditions must be reestablished in some portion of the circuit. In a closed loop second order system of the type shown in FIGURE 1, the initial conditions need be established on only one of the integrators or, in other words, on one of the two capacitors C1 and C2 which are shown in the system.

It can also be seen from the foregoing that rather than to establish a predetermined charge on the capacitor at predetermined intervals of time to correct for slight losses or regeneration which may occur, the amplitude can be stabilized by insuring that the capacitor is completely discharged at the beginning of each cycle to reestablish the initial condition. Thus, the initial condition is a zero voltage at the beginning of each cycle, rather than a fixed voltage at the beginning of each cycle. The fixed current which originates at the D.-C. source $E_{dc}$ establishes the amplitude of the sinusoid.

It will be noted that we have elected to reestablish the initial condition on the first integrator rather than on the second integrator. This is desirable because the output of the first integrator is not symmetrical about zero whereas the output of the second integrator 13 is symmetrical about zero. The advantage in reestablishing the initial condition in the first integrator is that the sinusoid from the first integrator has zero slope at the time during which the diode switch is closed. For this reason the wave shape of the sinusoid is distorted the least by the closing of the switch. When the diode switch 34 is closed, the output is no longer a sinusoid but the output is zero. Thus a slight flat spot may be produced on the top of the sinusoid by the closing of the switch. However, this does not appreciably affect the sinusoid because the diode switch 34 is closed for a very short time, e.g., a time which is long enough to insure that there is a negligible charge on the capacitor C1. It is for this reason that it is desirable that the differentiator 33 produce a very sharp spike so that the diode switch is only closed for this very short period of time.

The effect of closing of the diode switch on the wave shape of the sinusoid is further minimized by the fact that the second integrator 13 in effect filters the output from the first integrator so that any flat spot which is produced on the substantially zero slope portions of the sinusoid are filtered out so that they are no longer noticeable after passing through the second integrator 13.

Thus we have found that the circuit shown in FIGURE 1 produces a very high grade sinusoid. Another distinct advantage of the circuit shown in FIGURE 1 is that both a sine wave and a cosine wave are generated which have precisely a 90° phase difference. As is well known to those skilled in the art, it is often desirable to have available both a sine wave and a cosine wave which are precisely 90° out of phase.

Although no means is shown for varying the frequency of the system shown in FIGURE 1, such a means can be readily provided in a manner well known to those skilled in the art. However, for minimum distortion it is desirable that the length of time which the diode switch 34 is closed should be inversely proportional to the frequency of oscillation. Thus, the higher the frequency, the shorter the length of time the switch should be closed.

Figure 2:
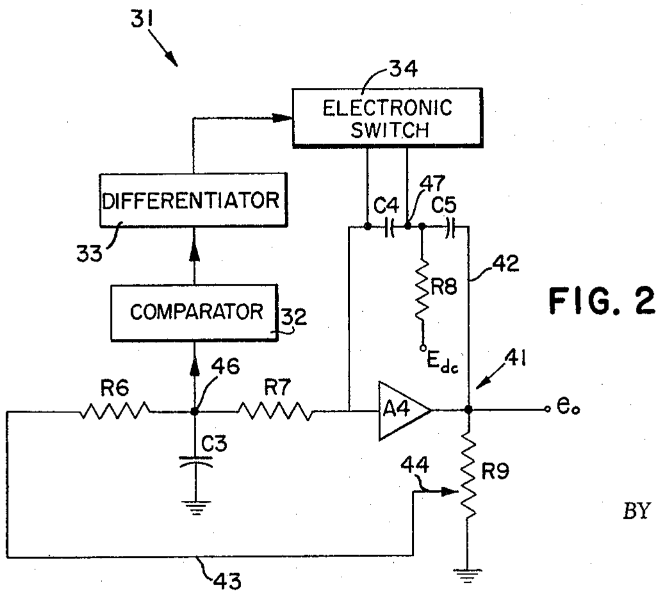
FIGURE 2 is a block diagram of a simplified precision oscillator incorporating our invention.

Another embodiment of our invention which is somewhat simpler than that which is shown in FIGURE 1 is disclosed in FIGURE 2. It also consists of a closed loop second order system with zero damping which contains a more elaborate configuration of passive elements so that only one operational amplifier is required.

As is well known to those skilled in the art, a basic requirement of a second order system is that there be two energy storage elements. One of the energy storage elements consists of the adjustable capacitors C4 and C5. This energy storage element has been split into two parts C4 and C5 to provide a T circuit in the feedback path 42 for the operational amplifier A4. The remainder of the T circuit is completed by a resistor R8 which has one end connected between the capacitor C4 and C5 and which has the other end connected to the voltage $E_{dc}$. The other storage element for the second order system is the capacitor C3 which is a part of the T-network provided in the input path 43 for the operational amplifier A4. One side of the adjustable capacitor C3 is connected to ground, whereas the other end is connected between a pair of resistors R6 and R7 which are serially connected in the input path 43. A potentiometer R9 provided with an adjustable tap 44 serves as a means for controlling the frequency of oscillation of the system 41.

From the arrangement described, it can be seen that we have provided a twin-T network both of which provide feedback from the output of the operational amplifier A4. The D.-C. voltage $E_{dc}$ again provides a constant current which determines the amplitude of the output sinusoid, that is, the sinusoid which is circulating within the system.

Again in order to provide means for reestablishing the initial condition in the system 41, it is necessary to find a point in the system at which the sinusoid passes through zero which is 90° out of phase with a point at which the switch is applied. In FIGURE 1 the point at which the wave 23 crosses zero is 90° out of phase with the point at which the diode switch 34 is applied. This same requirement is present in the simplified oscillator circuit which is shown in FIGURE 2. The nodes or points 46 and 47 of twin-T's have voltages which differ in phase by 90°. One of the points is utilized for the zero crossing detector point and the other point is the point at which the switch is applied. Thus, we have shown the input for the comparator 32 connected to the point 46 and the switch 34 connected to the point 47 across the capacitor C4. As the sinusoid passes through zero at point 46, a sharp pulse is produced by the differentiator 33 in the same manner as hereinbefore described in conjunction with FIGURE 1 to cause the switch 34 to close to force the point 47 to assume a value of zero. The sinusoid is therefore clamped to ground at point 47 at one or the other of its peak values, depending upon which zero crossing point is used, i.e., the zero point for the positive going wave or the zero point for the negative going wave.

It will be noted that we have only established the initial condition on one of the capacitors C4 and C5. This is true because the condition on one of the capacitors determines the amplitude on the sinusoid. Since one point of the sinusoid is fixed, the other points will have an amplitude determined by the fixed point.

From the foregoing it can be seen that to establish an initial condition during each cycle of the sinusoid, it is only necessary to find two points in the system which are 90° out of phase. One of these points can be utilized as a zero crossing detector, whereas the other point can be utilized for reestablishing the initial condition. The other point preferably should be one in which the sinusoid has zero slope so that the closing of the switch will have the least effect on the wave form of the sinusoid and therefore create the least distortion.

Figure 3:
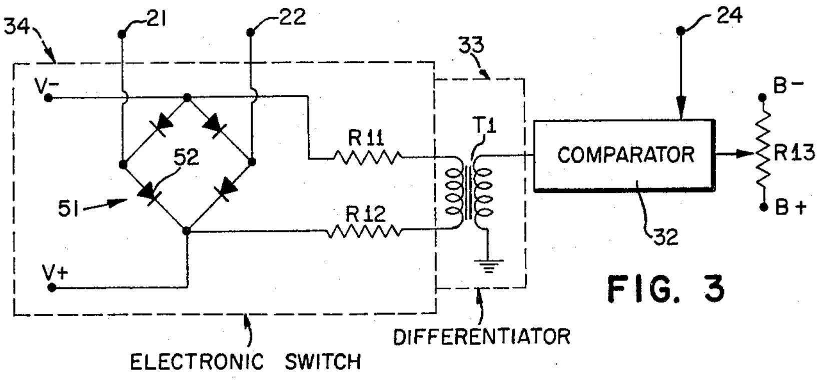
FIGURE 3 is a circuit diagram partially in block form of certain of the the circuitry utilized in the embodiments shown in FIGURES 1 and 2.

A suitable circuit for the means 31 for reestablishing an initial condition in a second order system is shown in FIGURE 3 and consists of a comparator 32. A Schmitt trigger circuit can be used as a comparator and is of a type well known to those skilled in the art. It is biased in a suitable manner by picking off an appropriate voltage across the potentiometer R13 which is connected to voltages indicated as B− and B+. The trigger circuit as is well known to those skilled in the art has a quasi-stable state which it will enter when the input goes negative, that is, when it crosses through zero in the negative going direction. When the sinusoid passes through zero in a positive going direction, it will enter its stable state.

We have chosen a Schmitt trigger circuit because it is very sensitive in detecting changes in amplitude of the applied voltage. The input to the Schmitt trigger circuit is biased so that when the input changes sign, that is, goes from positive to negative (passes through zero), the Schmitt trigger circuit will flip to its opposite state. In so doing it sends a large pulse through the pulse transformer T1 which serves as a differentiator to produce a sharp pulse in its output winding. As hereinbefore pointed out, the Schmitt trigger circuit generates a square wave which has a period which corresponds to the period of the sine wave. This square wave is not required but what is required is the transitions of the wave (the leading and trailing edges) when the trigger circuit flips from one state to the other. Thus it can be seen that the Schmitt trigger circuit is a comparator circuit and if desired any other suitable comparator circuit can be utilized.

The output of the pulse transformer T1 which serves as a differentiator is supplied to the top and bottom junctions of a diode bridge 51 through resistors R11 and R12. The electronic switch 32 consists of four diodes 52 arranged in a bridge configuration. The diodes 52 are normally biased in an off condition by the voltages V− and V+. When all of the diodes are biased off, the switch is off or open. The pulse transformer T1 generates pulses of two polarities which are applied to the top and bottom terminals of the bridge which counteracts the steady current which is flowing to bias the diodes off. When this occurs all four diodes 52 conduct to in effect apply a short circuit across the terminals 21 and 22 to thereby discharge any charge on the capacitor C1. As pointed out previously, the differentiator 33 should provide a pulse of adequate width to insure the discharge of the capacitor but it should not be so long as to keep the output of the amplifier at a constant voltage so that the sinusoid has a very large flat top.

It is apparent from the foregoing that we have provided a new and improved precision oscillator which has very low distortion in its output. This is true because the circuit as a whole has a relatively high Q. The circuit has high Q because the capacitors have a very low leakage and also because the amplifiers have a very high gain and introduce very little distortion. Although a slight distortion may be created by flat topping the sinusoid because of the switching action, this distortion is greatly improved or eliminated because the sinusoid is filtered by the second integrator. This low distortion is determined primarily by four components in the embodiment shown in FIGURE 1, the two resistors and the two capacitors R1 and C1 and R2 and C2. Since these few components also determine the frequency of the oscillator the output frequency is very stable.

It is also apparent from the foregoing that we have provided a precision oscillator which has excellent amplitude stability and in which the peak amplitude is referenced to the D.-C. voltage $E_{dc}$ which deterimnes the amplitude of the sinusoid. Thus, the accuracy of the amplitude is determined by the accuracy of the D.-C. supply. It follows from this that the circuit can be made with the variable frequency while still at the same time retaining the constant amplitude characteristic because as pointed out above the amplitude is determined by the D.-C. voltage.

We claim:

1. In a sine wave oscillator, a closed loop second order system having a pair of capacitive storage elements for producing a sinusoid, said system also having two signal points at which the voltages of the sinusoids at the two signal points have a predetermined phase relationship so that when the voltage of the sinusoid at one of the points passes through zero the voltage of the sinusoid at the other of the points is at substantially zero slope, one of the capacitive storage elements being connected to the other of the points, means for determining when said voltage of the sinusoid at said one point goes through zero, switch means connected to said other point and across said one storage element, and means connecting said means for determining when said voltage of the sinusoidal at said one point goes through zero to said switch means, said last named means including means for producing a signal when said one voltage goes through zero, said signal serving to close said switch for a predetermined interval of time to discharge said one capacitive storage element to re-establish the initial condition of the sinusoid at said other point.

2. An oscillator as in claim 1 wherein said predetermined phase relationship is a phase difference of 90°.

3. In a sine wave oscillator, a closed loop second order system generating a sinusoid having an initial condition, and means connected to said second order system for reestablishing said initial condition of said sinusoid at periodic intervals during oscillation and during the time the voltage curve for the sinusoid is at substantially zero slope.

4. An oscillator as in claim 3 together with means for applying a D.-C. voltage to the second order system so that it serves to determine the peak amplitude of oscillation.

5. An oscillator as in claim 3 wherein the closed loop second order system has at least one integrator including a feedback capacitor, and wherein said means for re-establishing the initial condition includes means for producing a pulse during each cycle of oscillation and switch means connected to said capacitor and operated by the pulse to discharge the capacitor.

6. In a sine wave oscillator, a closed loop second order system comprising first and second serially connected integrators each of the integrators having a feedback capacitor, an inverter connected to the output of the second integrator and a feedback loop connecting the output of the inverter to the input of the first integrator, said second order system serving to create a sinusoid, said sinusoid having an initial condition, the sinusoid appearing at the output of the first integrator and the sinusoid at the output of the second integrator having a phase difference of 90° so that when the sinusoid at the output of the second integrator is passing through zero the sinusoid at the output of the first integrator has a substantially zero slope, means connected to the output of the second integrator for determining when the sinusoid at the output of the second integrator passes through zero and periodically producing pulses when the sinusoid passes through zero, and switch means connected to the means for producing pulses and across the feedback capacitor of the first integrator, said pulses periodically closing said switch means to periodically discharge the feedback capacitor of the first integrator to re-establish the initial condition of the sinusoid.

7. An oscillator as in claim 6 together with means for applying a D.-C. voltage to the second integrator so that the peak amplitude of the sinusoid is determined by the D.-C. voltage.

8. An oscillator as in claim 6 wherein said means for determining when the sinusoid passes through zero and for producing a pulse includes a Schmitt trigger circuit and a differentiator connected to the output of the Schmitt trigger circuit.

9. An oscillator as in claim 6 wherein the switch means consists of a diode switch.

10. An oscillator as in claim 6 wherein said switch means consists of a diode bridge, means for biasing the diode bridge into a normally non-conducting condition, said pulse serving to periodically overcome said biasing means to periodically cause said diodes to conduct.

11. In a sine wave oscillator, first and second serially connected integrators, each of the integrators having a feedback capacitor, and an inverter connected to the output of the second integrator, a feedback loop connecting the output of the inverter to the input of the first integrator, said first and second serially connected integrators in combination with said inverter providing a second-order system which creates a sinusoid, said sinusoid having an initial condition, the sinusoid appearing at the output of the first integrator and the sinusoid appearing at another point in the second-order system having a phase differenence of 90° so that when the sinusoid at the other point in the second-order system is passing through zero, the sinusoid at the output of the first integrator has a substantially zero slope, means connected to the second-order system for determining when the sinusoid at the other point in the second-order system passes through zero and periodically producing pulses when the sinusoid at the other point in the second-order system passes through zero, and switch means connected to the means for producing pulses and to the feedback capacitor of the first integrator, said pulses causing closing of said switch to periodically discharge the feedback capacitor of the first integrator to establish the initial condition of the sinusoid.

References Cited by the Examiner

UNITED STATES PATENTS

| | | | |
|---|---|---|---|
| 3,064,144 | 11/1962 | Hardy | 307—88.5 |
| 3,137,825 | 6/1964 | Haner | 131—135 X |

FOREIGN PATENTS

| | | |
|---|---|---|
| 910,794 | 11/1962 | Great Britain. |

ROY LAKE, *Primary Examiner.*

S. H. GRIMM, *Assistant Examiner.*